United States Patent
Tange

(10) Patent No.: US 8,656,740 B2
(45) Date of Patent: Feb. 25, 2014

(54) MANUFACTURING METHOD OF GLASS-SEALED PACKAGE, AND GLASS SUBSTRATE

(75) Inventor: Yoshihisa Tange, Chiba (JP)

(73) Assignee: Seiko Instruments Inc., Chiba (JP)

( * ) Notice: Subject to any disclaimer, the term of this patent is extended or adjusted under 35 U.S.C. 154(b) by 596 days.

(21) Appl. No.: 12/708,881

(22) Filed: Feb. 19, 2010

(65) Prior Publication Data

US 2010/0215906 A1 Aug. 26, 2010

(30) Foreign Application Priority Data

Feb. 23, 2009 (JP) ................. 2009-039334

(51) Int. Cl.
C03C 27/00 (2006.01)

(52) U.S. Cl.
USPC ............... 65/155; 65/33.5; 65/152; 257/701; 257/704; 438/455; 438/456

(58) Field of Classification Search
None
See application file for complete search history.

(56) References Cited

U.S. PATENT DOCUMENTS

| | | | |
|---|---|---|---|
| 6,686,225 B2 | 2/2004 | Wachtler | |
| 6,955,976 B2 | 10/2005 | Hartwell et al. | |
| 7,859,084 B2 | 12/2010 | Utsumi et al. | |
| 2003/0102540 A1 | 6/2003 | Lee | |
| 2004/0219764 A1 | 11/2004 | Syllaios et al. | |
| 2005/0009299 A1 | 1/2005 | Wada et al. | |
| 2005/0009301 A1* | 1/2005 | Nagai et al. | 438/463 |
| 2007/0155056 A1 | 7/2007 | Kang et al. | |
| 2009/0018035 A1* | 1/2009 | Lee et al. | 506/33 |
| 2009/0197394 A1* | 8/2009 | Parekh | 438/462 |
| 2010/0207698 A1 | 8/2010 | Tange | |
| 2010/0237740 A1 | 9/2010 | Aratake et al. | |
| 2011/0220383 A1 | 9/2011 | Sugiyama | |
| 2011/0223363 A1 | 9/2011 | Sugiyama | |
| 2012/0225254 A1 | 9/2012 | Wagai | |
| 2012/0228744 A1 | 9/2012 | Kawada | |

FOREIGN PATENT DOCUMENTS

| | | |
|---|---|---|
| JP | 10-206458 A | 8/1998 |
| JP | 2000-077552 A | 3/2000 |
| JP | 2006-282480 A | 10/2006 |
| JP | 2006-339896 A | 12/2006 |
| JP | 2008-058005 A | 3/2008 |
| JP | 2010-124015 A | 6/2010 |
| WO | WO 2010/061470 A1 | 6/2010 |

OTHER PUBLICATIONS

Liu et al., "A New Approach to Fabricate Deep Cavities in Pyrex7740 Glass for Vacuum Packaging of Sensor", IEEE Sensors Conference, 2008, pp. 466-469.*

(Continued)

*Primary Examiner* — Matthew Daniels
*Assistant Examiner* — Lisa Herring
(74) *Attorney, Agent, or Firm* — Brinks Gilson & Lione

(57) ABSTRACT

The invention provides a manufacturing method of a glass-sealed package, and a glass substrate used for the glass-sealed package, whereby an amount of warp in a glass substrate is reduced to improve processing accuracy in a subsequent step in which the glass substrate is combined (such as by anodic bonding) with another glass substrate provided with a thin film. The front side of the glass substrate includes a region where the cavities used to house electronic devices such as semiconductor IC chips and crystal blanks are not formed. The region devoid of the cavities is provided in the formed of a frame to reduce an amount of warp in the glass substrate.

5 Claims, 5 Drawing Sheets

(56) References Cited

OTHER PUBLICATIONS

Turner et al., "Modeling of direct wafer bonding: Effect of wafer bow and etch patterns", Journal of Applied Physics, vol. 92 No. 12, Dec. 15, 2002, pp. 7658-7666.*
International Search Report for International Application No. PCT/JP2008/071646, dated Jan. 13, 2009, 1 page.
International Search Report for International Application No. PCT/JP2008/073043, dated Jan. 20, 2009, 1 page.
Office Action from co-pending U.S. Appl. No. 13/113,433, dated Sep. 5, 2012, 6 pages.
Office Action from co-pending U.S. Appl. No. 13/114,415, dated Oct. 19, 2012, 10 pages.
Office Action from co-pending U.S. Appl. No. 13/113,433, dated Mar. 5, 2013, 8 pages.
Office Action from co-pending U.S. Appl. No. 13/411,969, dated Mar. 15, 2013, 10 pages.
Notice of Allowance from co-pending U.S. Appl. No. 13/114,415, dated Jan. 28, 2013, 8 pages.
U.S. Appl. No. 13/113,433, filed May 23, 2011 in the United States Patent and Trademark Office.
U.S. Appl. No. 13/114,415, filed May 24, 2011 in the United States Patent and Trademark Office.
U.S. Appl. No. 13/406,992, filed Feb. 28, 2012 in the United States Patent and Trademark Office.
U.S. Appl. No. 13/411,969, filed Mar. 5, 2012 in the United States Patent and Trademark Office.

* cited by examiner

MANUFACTURING METHOD OF GLASS-SEALED PACKAGE, AND GLASS SUBSTRATE

RELATED APPLICATIONS

This application claims priority under 35 U.S.C. §119 to Japanese Patent Application No. 2009-039334 filed on Feb. 23, 2009, the entire content of which is hereby incorporated by reference.

FIELD OF THE INVENTION

The present invention relates to a manufacturing method of a glass-sealed package used for electronic devices such as semiconductor devices and crystal vibrators, and to a glass substrate used for such glass-sealed packages.

BACKGROUND ART

A manufacturing method of a glass substrate used for semiconductor devices such as image sensors is known as described in JP-A-2006-282480 and as illustrated in FIG. 5.

This publication describes providing grooves 502 on a glass substrate 501 so that the amount of warp in a thin-film attached glass substrate before being cut into individual pieces by methods such as dicing is reduced to substantially the same level as that in a thin-film attached glass substrate obtained when the glass substrate 501 having a thin film 503 is cut at the positions of the grooves 502. In this way, the glass substrate and a semiconductor wafer having a plurality of semiconductor elements can be combined with each other with improved processing accuracy for these elements.

SUMMARY OF THE INVENTION

However, the substrate warps, convex on the grooved side, when hollow spaces such as the grooves are formed in large numbers in the glass substrate without any space. When the amount of warp in the substrate is excessive, the registration accuracy suffers in the alignment performed in the step of combining the substrate with another substrate (such as by anodic bonding). In other words, processing accuracy suffers. This may lead to problems such as a failure to combine the substrates.

FIGS. 3A and 3B show schematic illustrations of a substrate provided with large numbers of grooves, or cavities as they are called, in which semiconductor devices such as semiconductor IC chips and crystal blanks are contained.

FIG. 3A illustrates a glass substrate. A plurality of cavities 302 for housing electronic devices is formed on a flat circular wafer, a glass substrate portion 301. The glass substrate portion 301 also includes a cutoff portion, an orientation flat 303, at an end. The cutting line A-A cuts across the cavities 302 formed on the glass substrate portion 301, parallel to the straight cut of the orientation flat 303. The cutting line B-B cuts across the cavities 302 formed on the glass substrate portion 301, perpendicular to the straight cut of the orientation flat 303. FIG. 3B represents the A-A cross section of the glass substrate portion 301, and the B-B cross section of the glass substrate portion 301.

It was found through experiment that the substrate warps, convex on the hollow space side, when grooves such as the cavities 302 are formed over the surface of the glass substrate portion 301 without any space, as illustrated in the A-A cross section and B-B cross section of FIG. 3B.

It is an object of the present invention to reduce an amount of warp in the substrate and to thereby improve the stability and accuracy of combining the substrate with another substrate.

In order to solve the foregoing problems, the present invention reduces an amount of warp in the substrate by providing a street portion, a region devoid of cavities, extending in a straight line from one end to the other end of the substrate in the form of a frame (a portion where the array pitch is wider than in other portions including the cavities), instead of providing the cavities over the whole surface of the glass substrate portion.

By the provision of the street portion, the registration accuracy can be stably maintained in the alignment performed in the mating step of combining the substrate with another substrate (such as by anodic bonding). That is, high accuracy and high stability can be realized at the same time.

As described above, an amount of warp in the glass substrate can be reduced with a manufacturing method of a glass-sealed package of the prevent invention, and with a glass substrate of the present invention. It is therefore possible to realize high registration accuracy and high stability in, for example, the alignment performed in the mating step, thus producing a high-quality glass-sealed package.

The number of street portions can be optimized according to the size of the substrate so as to minimize a loss in the number of products. In this way, the cost of the product can be minimized.

DETAILED DESCRIPTION OF THE PREFERRED EMBODIMENTS

Two embodiments of the present invention are described below. These embodiments relate to a glass-sealed package and a glass substrate used for, for example, crystal vibrators (not shown).

First Embodiment

Figure 1B:
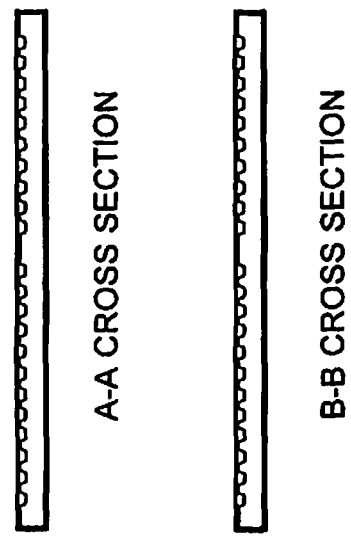
FIGS. 1A and 1B are schematic diagrams of a glass substrate according to a First Embodiment of the present invention.
Figure 1A:
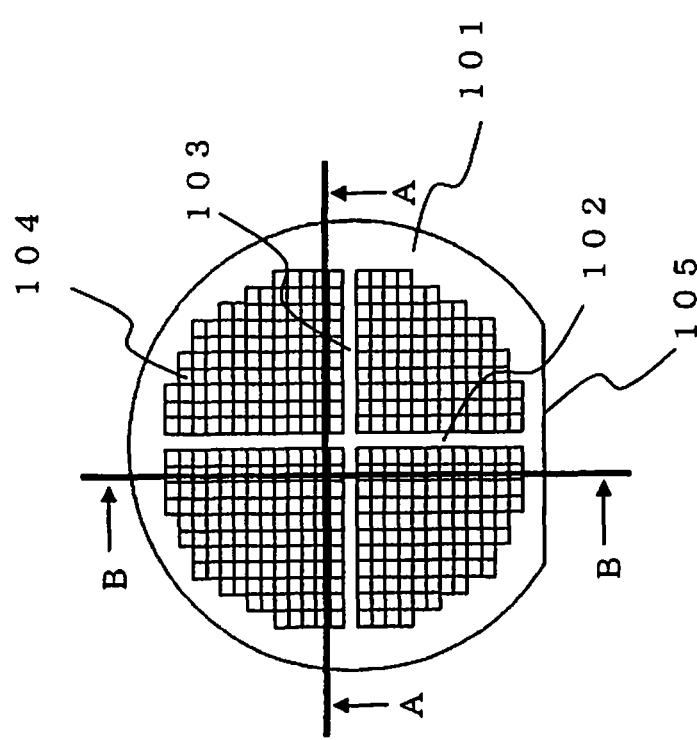

FIGS. 1A and 1B are diagrams representing a First Embodiment of a glass substrate of the present invention.

As illustrated in FIG. 1A, a glass substrate of the present invention includes a glass substrate portion 101, cavities 104 in which elements such as semiconductor chips and crystal blanks are housed by being mounted, and an orientation flat 105, which is a cutoff portion formed at one end of the glass substrate portion 101. To reduce warping of the substrate, street portions 102 and 103 are formed in portions of the glass substrate portion 101 where the cavities 104 are formed. The cavities 104 are not formed in the street portions 102 and 103. The street portion 102 is perpendicular to the orientation flat 105, and passes the central portion of the glass substrate portion 101. The street portion 103 is parallel to the orientation flat 105, and passes the central portion of the glass substrate portion 101. The street portions 102 and 103 are formed in a straight line from one end to the other end of the glass substrate portion 101. The cutting lines A-A and B-B drawn parallel and perpendicular to the orientation flat 105 correspond to the A-A cross section and B-B cross section, respectively, of FIG. 1B described below.

FIG. 1B shows the A-A cross section and B-B cross section. The A-A cross section and B-B cross section show the cavities 104 formed on the glass substrate portion 101. The A-A cross section also shows the street portion 102 where the cavities 104 are not formed. The B-B cross section also shows the street portion 103 where the cavities 104 are not formed.

A manufacturing method of the glass substrate 101 will be described later in detail with reference to the flow chart of FIG. 4.

In the present invention, the street portions 102 and 103 provided as shown in the First Embodiment serve as frames (framework) to reduce warping of the glass substrate 101.

The following describes a method for manufacturing a piezoelectric vibrator as a glass-sealed package in which a piezoelectric vibrating piece is housed in the cavities as an electronic device, using the glass substrate 101 of the First Embodiment.

For convenience, the glass substrate 101 provided with the cavities 104 will be referred to as a lid substrate, and the glass substrate without the cavities as a base substrate. The glass-sealed package of an embodiment of the present invention is realized by combining the lid substrate and the base substrate with an object placed in between.

Figure 4:
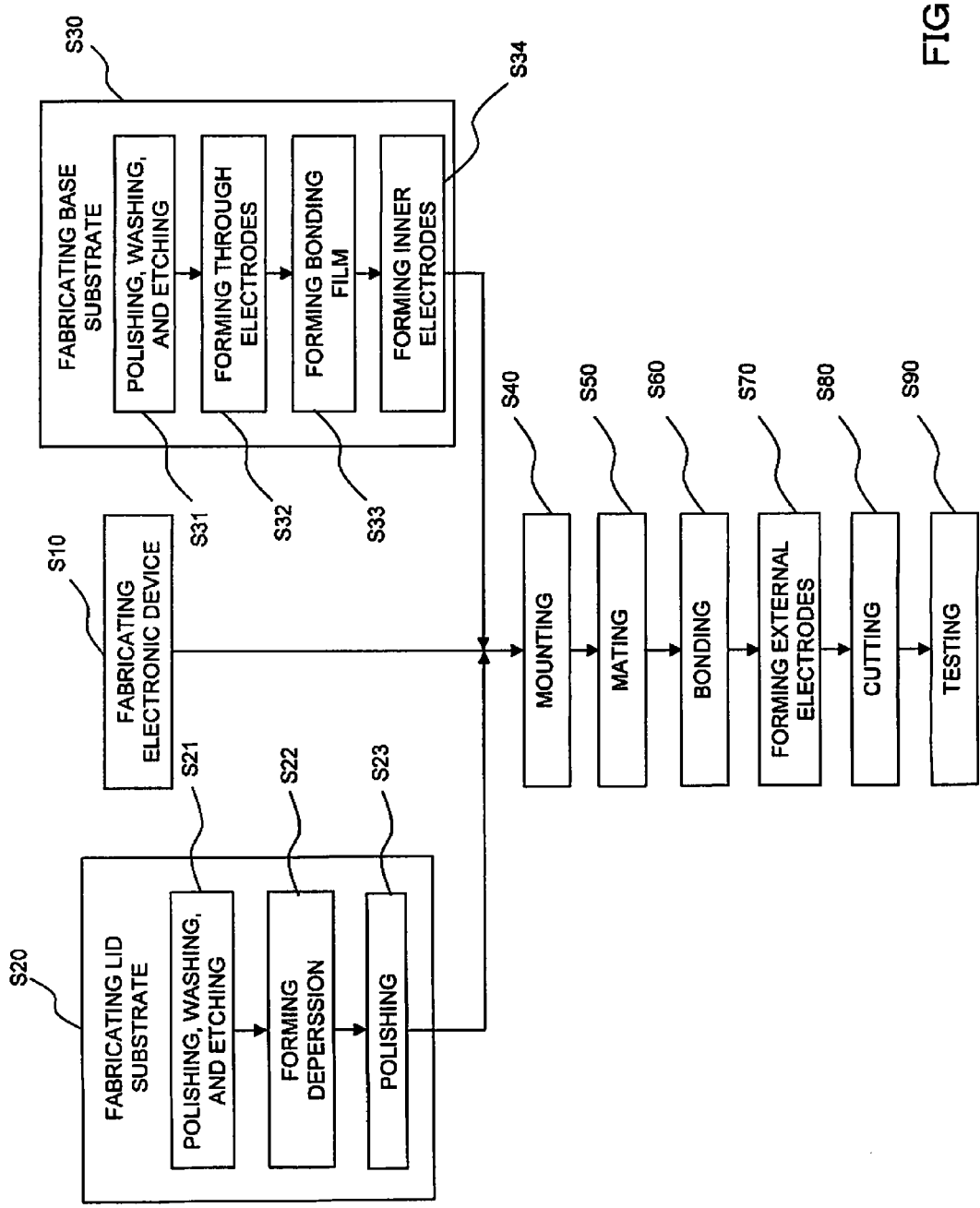
FIG. 4 is a flow chart representing a flow of a manufacture of a piezoelectric vibrator of an embodiment of the present invention.

The following describes a method for manufacturing a plurality of piezoelectric vibrators at once using the base substrate and the lid substrate, with reference to the flow chart of FIG. 4.

First, an electronic device (piezoelectric vibrator in this embodiment) is fabricated in an electronic device fabrication step (S10). Specifically, a crystal of a Lumbered quartz bar stone is sliced at a predetermined angle to provide a wafer of a constant thickness. The wafer is then coarsely processed by lapping, and optionally mirror finished such as by polishing to obtain a constant thickness. After appropriately processing the wafer by treatment such as washing, a metal film is deposited and patterned on the wafer by techniques such as photolithography and metal masking to form excitation electrodes on the piezoelectric vibrating piece, and inner electrodes, used to mount the piezoelectric vibrating piece, on the other glass substrate provided with no cavities. This completes the fabrication of a plurality of piezoelectric vibrating pieces.

Then, a lid substrate fabrication step is performed for the glass substrate 101 to make it usable for anodic bonding (S20). First, the glass substrate 101 made of soda-lime glass is polished to a predetermined thickness, and after washing, a disk-shaped glass substrate 101 is formed from which the work-affected layer on the outermost surface has been removed by etching or the like (S21). This is followed by a depression forming step in which a plurality of cavities 104 is formed by methods such as etching and embossing in the row and column directions on the bonding face of the glass substrate 101 (S22). Note that the rigidity of the glass substrate 101 with the cavities 104 is provided by the street portions 102 and 103 having no cavities 104 and formed in a straight line from one end to the other end of the lid substrate. The street portion 102 or the street portion 103 are formed perpendicular or parallel to the orientation flat 105, respectively. The street portions 102 and 103 are defined by an area of a straight line devoid of the cavities 104.

Concurrently with, or before or after this step, a base substrate fabrication step is performed in which the other glass substrate—the base substrate not provided with the cavities 104 and used to mount the piezoelectric vibrating piece—is fabricated to make it usable for anodic bonding (S30). First, soda-lime glass is polished to a predetermined thickness, and after washing, a disk-shaped base substrate wafer is formed from which the work-affected layer on the outermost surface has been removed by etching or the like (S31). This is followed by a through electrodes forming step in which pairs of through electrodes used to connect the piezoelectric vibrating piece to external terminal electrodes are formed in the base substrate wafer (S32). As with the glass substrate 101, the rigidity of the substrate is provided by the street portions 102 and 103, a region devoid of the through electrodes, provided in the form of streets crossing at the center of the glass substrate for the base substrate wafer.

Next, conductive material is patterned on the upper surface of the base substrate wafer to form a bonding film (bonding film forming step; S33) and the inner electrodes electrically connected to the through electrodes, respectively (inner electrodes forming step; S34).

The through electrodes are substantially flush with the upper surface of the base substrate wafer, as described above. Accordingly, the inner electrodes patterned on the upper surface of the base substrate wafer are closely in contact with the through electrodes without any gap or space. This ensures conductivity between one of the inner electrodes and one of the through electrodes, and between the other inner electrode and the other through electrode. This completes the second wafer fabrication step.

In FIG. 4, the inner electrodes forming step (S34) is performed after the bonding film forming step (S33); however, the bonding film forming step (S33) may be performed after the inner electrodes forming step (S34), or these steps may be performed simultaneously. The same effect can be obtained regardless of the order of the steps. Accordingly, the order of these steps may be changed appropriately, as needed.

Then, the piezoelectric vibrating pieces fabricated as above are bonded to the upper surface of the base substrate wafer via their respective inner electrodes (mount step; S40). First, bumps are formed on the inner electrodes, using gold wires. Then, with the basal portion of the piezoelectric vibrating piece placed on the bumps, the piezoelectric vibrating piece is pressed against the bumps while heating the bumps to a predetermined temperature. In this way, the bumps provide mechanical support for the piezoelectric vibrating piece, and the electrodes formed on the piezoelectric vibrating piece are electrically connected to the inner electrodes. Further, the bump bonding of one of the electrodes of the piezoelectric vibrating piece on one of the bumps, and the bump bonding of the other electrode of the piezoelectric vibrating piece on the other bump supports the piezoelectric vibrator parallel to the base substrate. As a result, the piezoelectric vibrating piece is supported by being suspended above the base substrate wafer. Here, the pair of excitation electrodes of the piezoelectric vibrating piece conducts to the pair of through electrodes, respectively.

After the piezoelectric vibrating piece is mounted, a mating step is performed in which the lid substrate is mated with the base substrate wafer (S50). Specifically, the wafers are aligned in position using reference marks or the like (not shown) as a marker. As a result, the piezoelectric vibrating piece mounted as above is housed in the cavity 104 surrounded by the wafers. After the mating step, the mated two wafers are placed in an anodic bonding machine to perform a bonding step in which the two wafers are anodically bonded together under application of a predetermined voltage in an atmosphere of a predetermined temperature in a vacuum (S60).

In the anodic bonding, a predetermined voltage is applied between the bonding film and the glass substrate. This causes an electrochemical reaction at the interface between the bonding film and the glass substrate, anodically bonding the two with tight adhesion.

Next, a cutting step is performed in which the wafer unit bonded as above is cut into individual piezoelectric vibrators (S80). As a result, a plurality of bilayer, surface-mounted piezoelectric vibrators is manufactured at once, each sealing the piezoelectric vibrating piece in the cavity 104 formed between the anodically bonded base substrate and lid substrate.

This is followed by a testing step to check for defects (S90). Specifically, measurement is made to check properties of the piezoelectric vibrating piece, such as resonant frequency, resonant resistance, and drive level characteristics (excitation power dependence of resonant frequency and resonant resistance). Other properties, such as insulation resistance characteristics are also checked. The piezoelectric vibrator is then subjected to an appearance test to check the dimensions, quality, and other conditions of the product. The manufacture of the piezoelectric vibrator is finished upon completion of the checking.

Figure 3A:
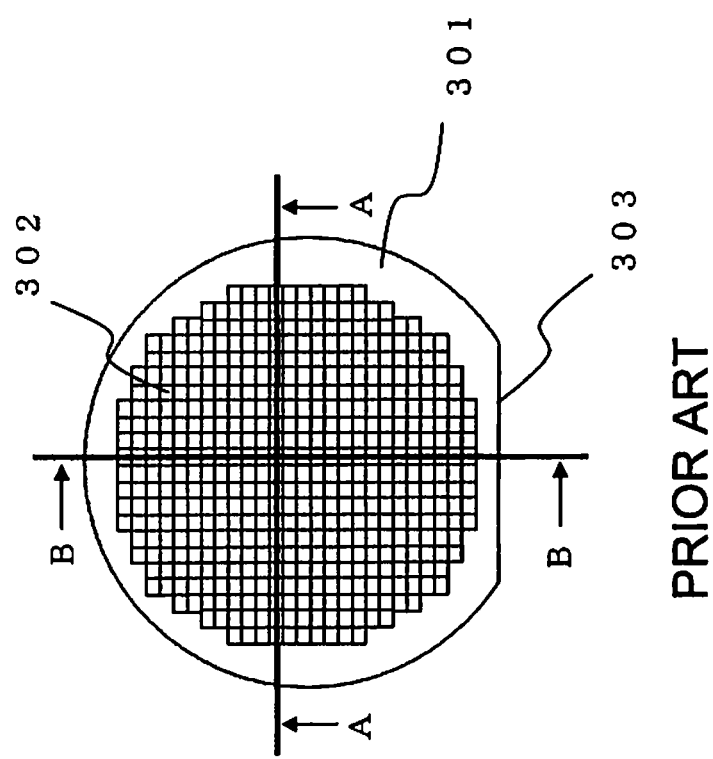
FIGS. 3A and 3B are schematic diagrams of a glass substrate not provided with a frame in a region of cavities.
Figure 3B:
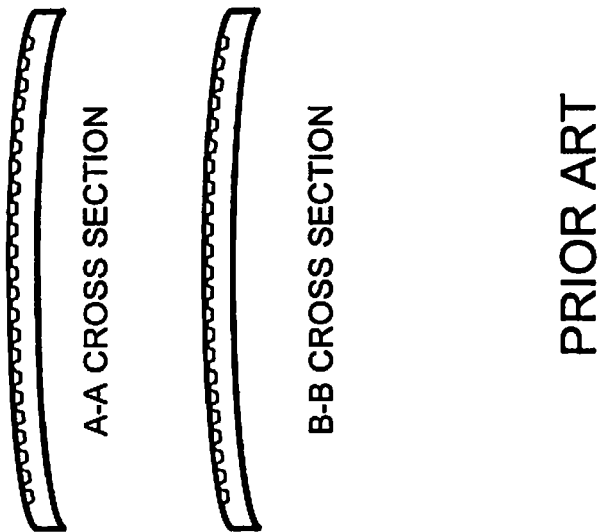
Figure 5:
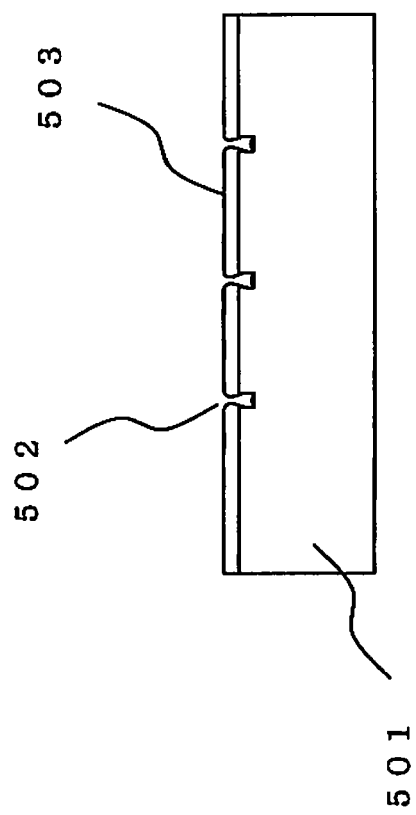
FIG. 5 is a cross sectional view of a conventional glass substrate.

The formation of the grooves 502 to reduce warping of the substrate has been proposed, as described in an embodiment of the foregoing related art JP-A-2006-282480 and as illustrated in FIG. 5. However, the substrate warps, convex on the cavity 302 side, when such grooves are formed over the whole surface of the glass substrate as illustrated in FIGS. 3A and 3B. The warping of the substrate becomes even worse when the surface is polished in the polishing step.

The street portions 102 and 103 provided as illustrated in the drawings of the First Embodiment of the present invention serve as frames (framework) to reduce warping of the glass substrate.

Second Embodiment

The Second Embodiment is described below with reference to FIGS. 2A and 2B.

Figure 2B:
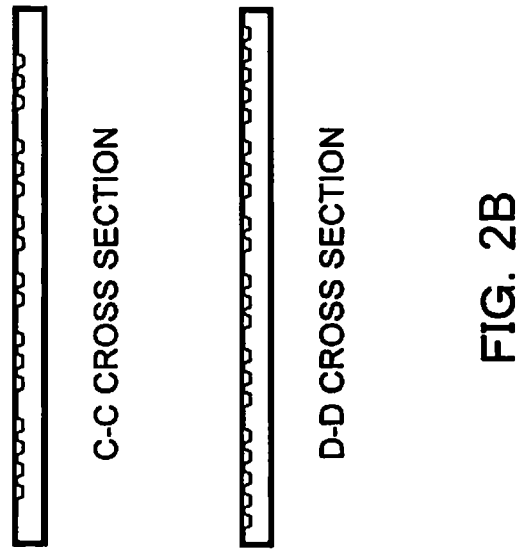
FIGS. 2A and 2B are schematic diagrams of a glass substrate according to a Second Embodiment of the present invention.
Figure 2A:
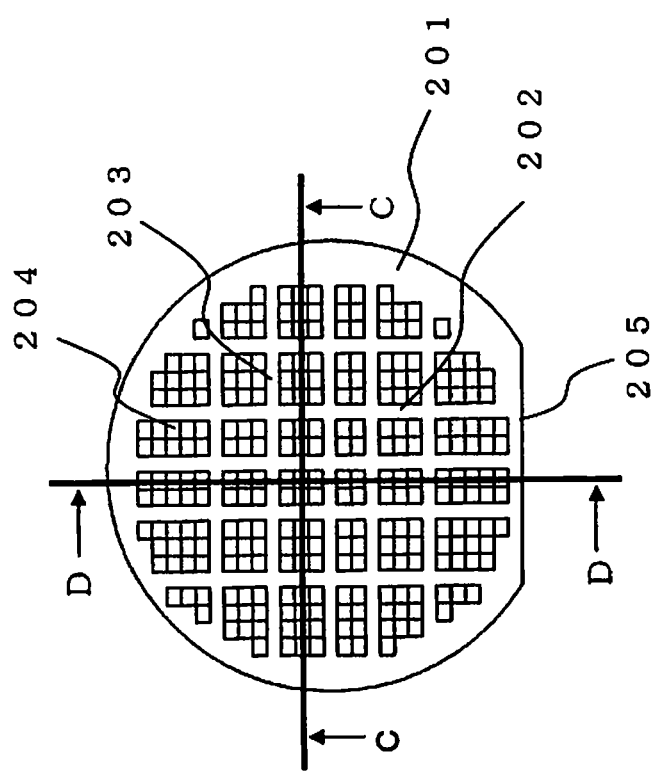

As illustrated in FIG. 2A, a glass substrate of the present invention includes a glass substrate portion 201, cavities 204 in which elements such as semiconductor chips and crystal blanks are housed by being mounted, and an orientation flat 205, which is a cutoff portion formed at one end of the glass substrate portion 201. To reduce warping of the substrate, street portions 202 and 203 are formed to partially replace the region where the cavities 204 are formed. The cavities 204 are not formed in the street portions 202 and 203. The street portions 202 are provided in a plurality, perpendicular to the orientation flat 205 and separating the cavities 204. The street portions 203 are provided in a plurality, parallel to the orientation flat 205 and separating the cavities 204. The street portions 202 and 203 are formed in a straight line from one end to the other end of the glass substrate portion 201. The cutting lines C-C and D-D drawn parallel and perpendicular to the orientation flat 205 correspond to the C-C cross section and D-D cross section, respectively, of FIG. 2B described below.

FIG. 2B shows the C-C cross section and D-D cross section. The C-C cross section and D-D cross section show the cavities 204 formed on the glass substrate portion 201. The C-C cross section also shows the street portions 202 where the cavities 204 are not formed. The D-D cross section also shows the street portions 203 where the cavities 204 are not formed.

A way to reduce the cost is to increase the number of chips that can be obtained from one substrate. This is achieved by increasing the size of the glass substrate. For such large substrates, single street portions such as the street portions 102 and 103 provided perpendicular and parallel to the orientation flat 105 as in the First Embodiment are not sufficient to reduce the warping of the substrate.

The warp in the substrate can then be reduced by increasing the number of street portions as in the street portions 203 and 204 shown in FIGS. 2A and 2B. However, in this case, the number of cavities 204 becomes smaller. In other words, the number of chips per substrate is reduced. Thus, the number of street portions 203 and 204 is optimized taking into consideration the cost determined by the size of the glass substrate and the number of chips per substrate.

With the street portions 202 and 203 that form a grid, warping of the substrate can be reduced even for large glass substrates.

The subsequent steps, including the polishing step, are performed as in the First Embodiment.

The manufacturing method of a plurality of piezoelectric vibrators is also in accordance with the flow chart described in the First Embodiment with reference to FIG. 4.

It should be noted that the present invention is not limited to the foregoing First and Second Embodiments. The circular substrate with an orientation flat may be rectangular or polygonal. Further, the base substrate and the lid substrate may be combined using a technique that enables combining of a glass lid substrate with a conductive substrate, using a conductive substrate for the base substrate.

Further, the foregoing described the cavities 104 formed only in the lid substrate; however, the cavities 104 may be formed only in the base substrate, or in both of the lid substrate and the base substrate.

The width of the street portions 102, 103, 202, and 203 is not necessarily required to match the width of one cavity, and can be increased or decreased under different conditions. When forming a plurality of street portions, the width of each street portion may be varied.

For example, though not illustrated, the street portion that is wide at the central portion of the glass substrate and that becomes narrower away from the central portion is also intended to be within the scope of the present invention.

A glass substrate of the present invention is suitable as the member used to mount and package electronic devices such as semiconductor IC chips, crystal blanks, and sensor elements.

What is claimed is:

1. A method for manufacturing a glass-sealed package that comprises: a lid substrate and a base substrate made of glass material on at least one of which includes an array of cavities; and an electronic device housed in the cavities formed between the lid substrate and the base substrate, the method comprising:
    fabricating the lid substrate or the base substrate so as to form therein a plurality of street portions defined by at least a portion of the substrate where the cavities are not formed and where a first street portion extends in a linear direction and a second street portion extends in a direction orthogonal to the first street portion,
    wherein at least one of the first and second street portions overlies a central region of the lid substrate or the base substrate,
    wherein a width of the street portions in the orthogonal direction with respect to the linear direction is greater than a separation distance between cavities in the orthogonal direction in the array of cavities, and the array of cavities are formed in groups in which the cavities in each group are adjacent to each other in the linear direction and in the orthogonal direction, and wherein the street portions are formed in a configuration to suppress warping of the lid substrate or the base substrate;

mating the lid substrate and the base substrate to house the electronic device in the cavities; and bonding the lid substrate and the base substrate to each other.

2. The method according to claim 1, wherein the cavities are arrayed two-dimensionally on the lid substrate or the base substrate, and wherein the street portions are defined by a predetermined space devoid of cavities along any one-dimensional direction of the cavities.

3. The method according to claim 1, wherein fabricating the lid substrate or the base substrate further comprises forming an orientation flat on a portion of a periphery of the substrate.

4. The method according to claim 3, wherein fabricating the lid substrate or the base substrate to form a plurality of street portions comprises forming the street portions either parallel to the orientation flat or perpendicular to the orientation flat.

5. The method according to claim 1, wherein each street portion extends in a linear direction and in which a pitch of the street portions in the orthogonal direction is greater than a pitch of cavities in the orthogonal direction.

* * * * *